(12) United States Patent
Kido

(10) Patent No.: US 11,101,839 B2
(45) Date of Patent: Aug. 24, 2021

(54) HIGH FREQUENCY FILTER, MULTIPLEXER, HIGH FREQUENCY FRONT-END CIRCUIT, AND COMMUNICATION DEVICE

(71) Applicant: Murata Manufacturing Co., Ltd., Kyoto (JP)

(72) Inventor: Syunsuke Kido, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/830,661

(22) Filed: Mar. 26, 2020

(65) Prior Publication Data
US 2020/0228155 A1 Jul. 16, 2020

Related U.S. Application Data

(63) Continuation of application No. PCT/JP2018/030632, filed on Aug. 20, 2018.

(30) Foreign Application Priority Data

Sep. 29, 2017 (JP) .............................. JP2017-191642

(51) Int. Cl.
*H04B 1/40* (2015.01)
*H03H 9/54* (2006.01)
*H04W 88/06* (2009.01)

(52) U.S. Cl.
CPC ............... *H04B 1/40* (2013.01); *H03H 9/542* (2013.01)

(58) Field of Classification Search
CPC ........ H03H 9/542; H03H 9/70; H03H 9/6489; H04B 1/40; H04W 88/06

USPC ................................ 333/186, 187, 175, 193
See application file for complete search history.

(56) References Cited

U.S. PATENT DOCUMENTS

| 2009/0128260 | A1  | 5/2009 | Block et al. |
| 2017/0094662 | A1  | 3/2017 | Ebihara et al. |
| 2017/0134005 | A1* | 5/2017 | Takeuchi ............... H03H 9/542 |
| 2017/0250134 | A1* | 8/2017 | Sturcken ............. H01F 41/0206 |
| 2018/0138893 | A1* | 5/2018 | Caron ...................... H03H 9/25 |

FOREIGN PATENT DOCUMENTS

| EP | 2 416 496 A1 | 2/2012 |
| JP | 2006-324489 A | 11/2006 |
| JP | 2009-538005 A | 10/2009 |
| JP | 2017-063315 A | 3/2017 |
| WO | 2010-116776 A1 | 10/2010 |
| WO | 2016-013659 A1 | 1/2016 |

OTHER PUBLICATIONS

International Search Report for International Application No. PCT/JP2018/030632 dated Oct. 23, 2018.
Written Opinion for International Application No. PCT/JP2018/030632 dated Oct. 23, 2018.

\* cited by examiner

*Primary Examiner* — Lee Nguyen
(74) *Attorney, Agent, or Firm* — Pearne & Gordon LLP

(57) ABSTRACT

A high frequency filter includes series arm resonators and parallel arm resonators as acoustic wave resonators and at least one inductor, wherein capacitive components of the acoustic wave resonators constitute an LPF and an HPF as hybrid filters with an inductor or with an inductor and a capacitor, and the at least one inductor includes inductors as mount component inductors.

16 Claims, 8 Drawing Sheets

HIGH FREQUENCY FILTER, MULTIPLEXER, HIGH FREQUENCY FRONT-END CIRCUIT, AND COMMUNICATION DEVICE

This is a continuation of International Application No. PCT/JP2018/030632 filed on Aug. 20, 2018 which claims priority from Japanese Patent Application No. 2017-191642 filed on Sep. 29, 2017. The contents of these applications are incorporated herein by reference in their entireties.

BACKGROUND

Technical Field

The present disclosure relates to high frequency filters, multiplexers, high frequency front-end circuits, and communication devices, each of which includes an acoustic wave resonator.

High frequency filters, each including a LC resonant circuit and an acoustic wave resonator have been disclosed (for example, see patent document 1). In the high frequency filter, the acoustic wave resonator and the LC resonant circuit, each constitutes a band elimination filter (BEF). This enables to form two stopbands, which are a stopband formed by the acoustic wave resonator near a passband and a stopband formed by the LC resonant circuit. The latter stopband is equal to or higher than one octave above the former stopband formed by the acoustic wave resonator.

Patent Document 1: Japanese Unexamined Patent Application Publication (Translation of PCT Application) No. 2009-538005

BRIEF SUMMARY

However, although the foregoing prior art high frequency filter can increase the level of steepness of an attenuation slope formed between the passband and the stopband by a steep attenuation pole formed by the acoustic wave resonator, because an inductor being used is formed using a wiring pattern conductor within a substrate that constitutes the high frequency filter, the Q-factor is small and therefore the bandpass characteristic of the high frequency filter degrades. Further, the inductor formed using the wiring pattern conductor has an inductance value that varies depending on accuracy of width and thickness of the pattern. This increases deviation of the inductance values and causes the filter characteristic to vary.

The present disclosure is made to resolve the foregoing issue and provides a high frequency filter and the like, which enable to improve the filter characteristic.

A high frequency filter according to one aspect of the present disclosure includes an acoustic wave resonator and at least one inductor, wherein a capacitive component of the acoustic wave resonator constitutes a hybrid filter with an inductor or with an inductor and a capacitor, and the at least one inductor includes a mount component inductor.

According to this, a mount component inductor having a large Q-factor is included in the inductor of the high frequency filter using the filter (so-called hybrid filter) constituted of the capacitive component of the acoustic wave resonator with the inductor or with the inductor and the capacitor. This enables to improve the bandpass characteristic of the high frequency filter. Further, a mount component inductor has a small inductance value deviation. This enables to reduce variations of the filter characteristic.

Further, the at least one inductor may include a first inductor that constitutes the hybrid filter, and the first inductor may be the mount component inductor.

This enables to increase the Q-factor of the first inductor that constitutes a LC resonant circuit with the capacitive component of the acoustic wave resonator and improve the filter characteristic of the high frequency filter including the first inductor.

Further, the high frequency filter may further include a capacitor, wherein the at least one inductor may include a second inductor that constitutes a LC resonant circuit with the capacitor, and the second inductor may be the mount component inductor.

This enables to increase the Q-factor of the second inductor that constitutes the LC resonant circuit with the capacitor and improve the filter characteristic of the high frequency filter including the second inductor.

Further, a frequency of a first attenuation pole formed by the acoustic wave resonator and a frequency of a second attenuation pole formed by the mount component inductor may be included in one stopband of the high frequency filter, and the frequency of the first attenuation pole may be positioned closer to a passband of the high frequency filter than the frequency of the second attenuation pole.

In the high frequency filter configured in this way, the frequency of the first attenuation pole is positioned close to the passband of the high frequency filter. Therefore, the first attenuation pole having a steep shape formed by the acoustic wave resonator enables to increase the steepness of an attenuation slope formed between the passband and the one stopband of the high frequency filter and reduce the insertion loss in the passband. Further, the frequency of the first attenuation pole and the frequency of the second attenuation pole are included within the one stopband. In other words, the first attenuation pole and the second attenuation pole form the one stopband. Therefore, this one stopband can be broadened using the second attenuation pole having a gentle shape formed by the LC resonant circuit constituted of the mount component inductor. Accordingly, broadening of the stopband can be realized while reducing the insertion loss within the passband. Further, a mount component inductor has a large Q-factor and a small inductance value deviation. This enables to further reduce the insertion loss within the passband and reduce variations of the insertion loss.

Further, a Q-factor of the mount component inductor may be 20 or more at 2 GHz.

In this way, the mount component inductor enables to realize a Q-factor of 20 or more at 2 GHz.

Further, the mount component inductor may be an inductor of multilayer type, an inductor of wire-wound type, or an integrated passive device.

In this way, the mount component inductor can be realized using an inductor of multilayer type, an inductor of wire-wound type, or an integrated passive device.

Further, a direction of magnetic flux of the mount component inductor may be a direction parallel to a principal surface of a substrate on which the mount component inductor is mounted.

In general, a ground solid pattern is provided on a substrate in the direction parallel to the principal surface of the substrate. Therefore, in the case where the direction of magnetic flux of the inductor is perpendicular to the principal surface (ground solid pattern), eddy currents are generated on the ground solid pattern, and the Q-factor of the inductor degrades. Whereas, the direction of magnetic flux of the mount component inductor is parallel to the principal surface. This prevents eddy currents from being generated on the ground solid pattern and enables to suppress degradation of the Q-factor of the mount component inductor.

Further, the at least one inductor may include a plurality of the mount component inductors, and the plurality of the mount component inductors may include at least two inductors whose magnetic fluxes are in directions different from each other.

This prevents electromagnetic coupling between the mount component inductors. Therefore, variation of the filter characteristic caused by interaction between the mount component inductors can be suppressed.

Further, the at least one inductor may include a plurality of the mount component inductors, the plurality of the mount component inductors may include at least two inductors connected in series, the directions of the magnetic fluxes of the at least two inductors may be the same with each other, and the at least two inductors may be electromagnetically coupled.

Because of this, in the case where at least two inductors are connected in series, a larger inductance value can be obtained by aligning the directions of the magnetic fluxes of the at least two inductors. That is to say, even in the case where the sum of the inductance values of the inductors is less than a desired inductance value, the desired inductance value can be obtained by electromagnetically coupling these inductors. Further, in general, a mount component inductor having a smaller inductance value has a larger Q-factor. Therefore, by connecting in series and electromagnetically coupling inductors each having a smaller inductance value, the Q-factor can be increased while obtaining a desired inductance value.

Further, the hybrid filter may be a highpass filter or a lowpass filter.

This enables to form a broad passband using a lowpass filter or a highpass filter.

Further, the acoustic wave resonator may be a series arm resonator that constitutes a ladder circuit, and the first inductor that constitutes the hybrid filter may be connected in parallel to the acoustic wave resonator.

This enables to form a broad stopband using a LC resonant circuit constituted of the first inductor and the capacitive component of the acoustic wave resonator.

Further, a multiplexer according to one aspect of the present disclosure includes a plurality of filters including at least one of the foregoing high frequency filters, wherein input terminals or output terminals of the plurality of filters are connected to a common terminal directly or indirectly.

This enables to provide the multiplexer capable of improving the filter characteristic.

Further, a high frequency front-end circuit according to one aspect of the present disclosure includes the foregoing multiplexer and a switch directly or indirectly connected to the multiplexer.

This enables to provide the high frequency front-end circuit capable of improving the filter characteristic.

Further, a high frequency front-end circuit according to one aspect of the present disclosure includes the foregoing multiplexer and an amplifier circuit directly or indirectly connected to the multiplexer.

This enables to provide the high frequency front-end circuit capable of improving the filter characteristic.

Further, a communication device according to one aspect of the present disclosure includes a RF signal processing circuit that processes a high frequency signal received by or to be transmitted from an antenna element, and the foregoing high frequency front-end circuit that sends the high frequency signal between the antenna element and the RF signal processing circuit.

This enables to provide the communication device capable of improving the filter characteristic.

The high frequency filters and the like according to the present disclosure enable to improve the filter characteristic.

DETAILED DESCRIPTION

Figure 1:
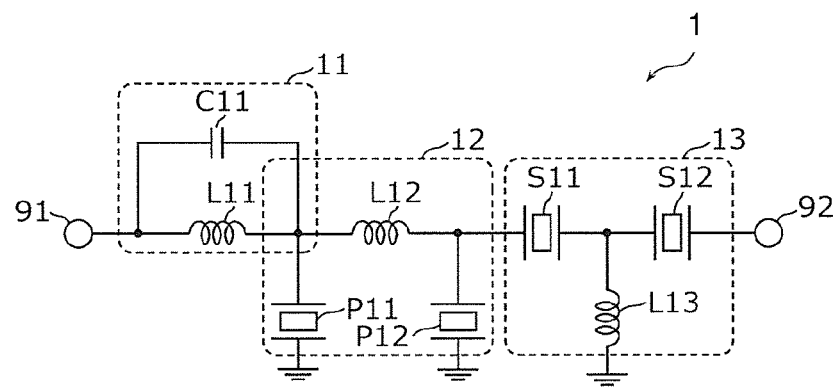
FIG. 1 is a circuit configuration diagram of a high frequency filter according to a working example 1.

Hereinafter, embodiments of the present disclosure will be described in detail with reference to the drawings. Note that the embodiments, which will be described below, each illustrates a comprehensive or specific example. Numeric values, shapes, materials, configuration elements, arrangements, and connection modes of the configuration elements, and the like illustrated in the following embodiments are mere examples, and not intended to limit the present disclosure. Of configuration elements in the following embodiments, the configuration elements that are not described in an independent claim will be described as optional configuration elements. Further, in the drawings, the same reference code is given to substantially the same configuration elements, and in some cases an overlapping description is omitted or simplified. Further, in the following embodiments, the term "connect" means not only the case of direct connection, but also means the case where an electrical connection is established via another element or the like.

Embodiment 1

In the following section, the configuration and the filter characteristic of a high frequency filter according to the first embodiment are described using working examples 1 to 4. The working examples 1 to 4 have a common feature that each high frequency filter includes an acoustic wave resonator and at least one inductor that includes a first inductor constituting a LC resonant circuit with a capacitive component of the acoustic wave resonator, the at least one inductor including a mount component inductor. The LC resonant circuit constituted of the inductor and the capacitive component of the acoustic wave resonator or the like is referred to as a hybrid filter. The working examples 1 to 4 are described below using FIG. 1 to FIG. 8.

1. Working Example 1

The configuration of a high frequency filter 1 according to the working example 1 is described.

FIG. 1 is a circuit configuration diagram of the high frequency filter 1 according to the working example 1. The high frequency filter 1 illustrated in FIG. 1 includes inductors L11, L12, and L13, a capacitor C11, series arm resonators S11 and S12, parallel arm resonators P11 and P12, and input/output terminals 91 and 92. In the case where the input/output terminal 91 is an input terminal to which a high frequency signal is input, the input/output terminal 92 is an output terminal, and in the case where the input/output terminal 92 is the input terminal to which a high frequency signal is input, the input/output terminal 91 is the output terminal.

The inductor L11 is a second inductor that constitutes a part of a LC resonant circuit 11 and is provided on a path connecting the input/output terminal 91 and the input/output terminal 92. The inductor L11 is connected to the input/output terminal 91. The inductor L12 is the first inductor provided on the path and is connected to the inductor L11. The series arm resonators S11 and S12 are acoustic wave resonators provided on the path. The series arm resonator S11 is connected to the inductor L12, and the series arm resonator S12 is connected to the series arm resonator S11 and the input/output terminal 92. The inductor L11, the inductor L12, the series arm resonator S11, and the series arm resonator S12 are connected in series on the path.

The capacitor C11 is a capacitor connected in parallel to the inductor L11. The capacitor C11 constitutes, together with the inductor L11, a LC parallel resonant circuit that serves as the LC resonant circuit 11.

The parallel arm resonators P11 and P12 are each an acoustic wave resonator connected between ground and a node on the path connecting the input/output terminal 91 and the input/output terminal 92. The node is directly connected to the inductor L12. Specifically, the parallel arm resonator P11 is connected to the ground and the node between the inductor L11 and the inductor L12, and the parallel arm resonator P12 is connected to the ground and the node between the inductor L12 and the series arm resonator S11. The inductor L12 constitutes a lowpass filter (LPF) 12 with capacitive components of the parallel arm resonators P11 and P12. Note that the term "directly connected" means "connected without necessarily any other component interposed therebetween".

The inductor L13 is the first inductor connected between the ground and a node on the path connecting the input/output terminal 91 and the input/output terminal 92. The node is directly connected to the series arm resonators S11 and S12. Specifically, the inductor L13 is connected to the ground and the node between the series arm resonators S11 and S12. The inductor L13 constitutes a highpass filter (HPF) 13 with capacitive components of the series arm resonators S11 and S12.

As described above, the inductor L12 (first inductor) constitutes the LPF 12 (LC resonant circuit) with the capacitive components of the parallel arm resonators P11 and P12 (acoustic wave resonators), and the inductor L13 (first inductor) constitutes the HPF 13 (LC resonant circuit) with the capacitive components of the series arm resonators S11 and S12 (acoustic wave resonators). Further, the inductor L11 (second inductor) constitutes the LC resonant circuit 11 with the capacitor C11.

Note that each of the number of the second inductors and the number of the capacitors constituting the LC resonant circuit 11 is not limited to one and may be two or more. Further, the number of the first inductors (series connection number) constituting the LPF 12 is not limited to one and may be two or more, and the number of the acoustic wave resonators (parallel connection number) constituting the LPF 12 is not limited to two and may be one or three or more. Further, the number of the first inductors (parallel connection number) constituting the HPF 13 is not limited to one and may be two or more, and the number of the acoustic wave resonators (series connection number) constituting the HPF 13 may be one or three or more. Further, the high frequency filter 1 includes one LC resonant circuit 11 but may include two or more LC resonant circuits.

At least one acoustic wave resonator (in the working example 1, the series arm resonators S11 and S12 and the parallel arm resonators P11 and P12) is a resonator that uses an acoustic wave and is, for example, a resonator utilizing a surface acoustic wave (SAW), a resonator utilizing a bulk acoustic wave (BAW), a film bulk acoustic resonator (FBAR), or the like. Note that SAW includes not only a surface wave but also a boundary wave. Here, it is assumed that the at least one acoustic wave resonator is a SAW resonator. This enables the high frequency filter 1 to be constituted of an interdigital transducer (IDT) electrode formed on a substrate having piezoelectricity, thereby enabling to realize a small low-profile filter circuit having a steep bandpass characteristic. Note that the substrate having piezoelectricity is a substrate at least having piezoelectricity on a surface of the substrate. The substrate includes a piezoelectric thin film on the surface and may be constituted of a film whose acoustic velocity is different from that of the piezoelectric thin film and a multilayer structure such as a support substrate or the like. Further, the substrate may be, for example, a multilayer structure including a high acoustic velocity support substrate and a piezoelectric thin film formed on the high acoustic velocity support substrate, a multilayer structure including a high acoustic velocity support substrate, a low acoustic velocity film formed on the high acoustic velocity support substrate, and a piezoelectric thin film formed on the low acoustic velocity film, or a multilayer structure including a support substrate, a high acoustic velocity film formed on the support substrate, a low acoustic velocity film formed on the high acoustic velocity film, and a piezoelectric thin film formed on the low acoustic velocity film. Note that the substrate may have piezoelectricity on the entirety of the substrate. The same applies to acoustic wave resonators described in the working examples 2 to 4, and the description thereof is omitted in the working examples 2 to 4.

Next, the filter characteristic of the high frequency filter 1 according to the working example 1 is described.

Figure 2:
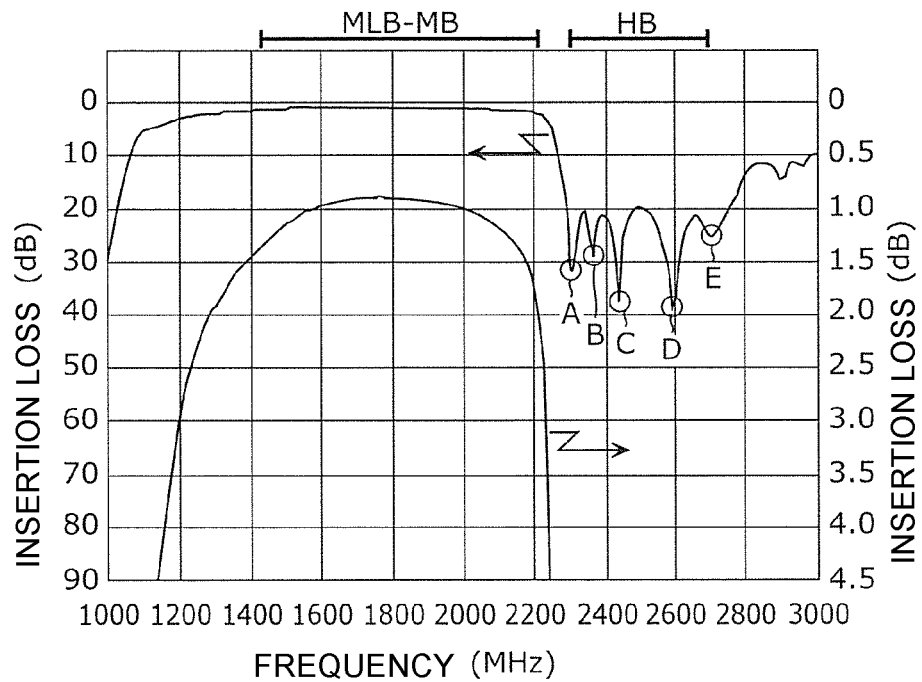
FIG. 2 is a diagram illustrating a filter characteristic of the high frequency filter according to the working example 1.

FIG. 2 is a diagram illustrating the filter characteristic of the high frequency filter 1 according to the working example 1.

The series arm resonators S11 and S12 and the parallel arm resonators P11 and P12 have capacitive components. Therefore, the LPF 12 is constituted by connecting the inductor L12 and the parallel arm resonators P11 and P12, and the HPF 13 is constituted by connecting the inductor L13 and the series arm resonator S11 and S12.

In the high frequency filter 1, the LPF 12 and the HPF 13 enable to form a broad passband. For example, one single broad passband can be formed by designing the LPF 12 and the HPF 13 in such a way that a passband of the LPF 12 and a passband of the HPF 13 become continuous. Further, the series arm resonators S11 and S12, the parallel arm resonators P11 and P12, and the LC resonant circuit 11, each functions as a notch filter that locally attenuates the bandpass characteristic at their respective resonant frequencies or anti-resonant frequencies by appropriately adjusting their respective design parameters. This allows the series arm resonators S11 and S12, the parallel arm resonators P11 and P12, and the LC resonant circuit 11 to locally attenuate parts of the broad passband formed by the LPF 12 and the HPF 13. By attenuating parts of the broad passband, for example, two passbands can be formed in a lower frequency range below and a higher frequency range above an attenuated frequency band. Note that the resonant frequency is a frequency at which the impedance of a resonator or a resonant circuit is a local minimum (ideally, 0), and that the anti-resonant frequency is a frequency at which the impedance of a resonator or a resonant circuit is a local maximum (ideally, infinity).

For example, an attenuation pole illustrated in part A of FIG. 2 (referred to as attenuation pole A) corresponds to an anti-resonant frequency of the series arm resonator S12, an attenuation pole illustrated in part B of FIG. 2 (referred to as attenuation pole B) corresponds to an anti-resonant frequency of the series arm resonator S11, an attenuation pole illustrated in part C of FIG. 2 (referred to as attenuation pole C) corresponds to a resonant frequency of the parallel arm resonator P11, and an attenuation pole illustrated in part D of FIG. 2 (referred to as attenuation pole D) corresponds to a resonant frequency of the parallel arm resonator P12. Further, for example, an attenuation pole illustrated in part E of FIG. 2 (referred to as attenuation pole E) corresponds to a resonant frequency of the LC resonant circuit 11.

As illustrated in FIG. 2, the frequencies of the attenuation poles A to D (first attenuation pole) constituted of the anti-resonant frequencies of the series arm resonators S11 and S12 and the anti-resonant frequencies of the parallel arm resonators P11 and P12 and the frequency of the attenuation pole E (second attenuation pole) constituted of the resonant frequency of the LC resonant circuit 11 are included in one stopband of the high frequency filter 1. This allows the attenuation poles A to D and the attenuation pole E to form the one stopband. Therefore, this one stopband can be broadened using the attenuation pole E having a gentle shape formed by the LC resonant circuit 11. Note that the one stopband is, for example, a band where the insertion loss is equal to or more than 10 dB. Specifically, one stopband is a frequency band from the frequency at which the insertion loss having been increasing become equal to or higher than 10 dB to the frequency at which the insertion loss becomes equal to or less than 10 dB, as the frequency increases. For example, in the case where, as the frequency increases, the insertion loss becomes equal to or higher than 10 dB and then becomes equal to or less than 10 dB and again becomes equal to or higher than 10 dB and then becomes equal to or less than 10 dB, it means there are two stopbands.

Further, the frequencies of the attenuation poles A to D are positioned closer to the passband of the high frequency filter 1 than the frequency of the attenuation pole E. The steepness of an attenuation pole formed by an acoustic wave resonator is high, and the frequencies of the attenuation poles A to D (particularly, the attenuation pole A) are positioned close to the passband of the high frequency filter 1. This enables the attenuation poles A to D having steep shapes to increase the steepness of an attenuation slope formed between the passband and the foregoing one stopband of the high frequency filter 1.

In the working example 1, the passband of the high frequency filter 1 is from 1423 MHz to 2200 MHz, which is a band extending from a middle low band (MLB) to a middle band (MB), by appropriately adjusting design parameters of the series arm resonators S11 and S12, the parallel arm resonators P11 and P12, the inductors L11 to L13, and the capacitor C11. Further, the stopband of the high frequency filter 1 is from 2300 MHz to 2690 MHz, which is High Band (HB).

This enables to realize a high frequency filter having a broad passband extending from 1423 MHz to 2200 MHz with a steep attenuation slope on the high frequency side and a broad stopband extending from 2300 MHz to 2690 MHz, which exists in a higher frequency range above the passband. As described above, broadening of the stopband can be realized while reducing the insertion loss within the passband.

Further, at least one of the inductors L11 to L13 is a mount component inductor. That is to say, all the inductors L11 to L13 may be mount component inductors, or at least one of the inductors L11 to L13 may be a mount component inductor. Note that over half (one-half or more) of at least one inductor included in the high frequency filter 1 can be a mount component inductor. Particularly, to improve the bandpass characteristic, the inductor constituting a circuit that forms an attenuation pole close to the passband can be a mount component inductor. Similarly, in the following working examples, over half (one-half or more) of at least one inductor included in a high frequency filter can be a mount component inductor.

The foregoing mount component is a component to be mounted on a substrate that constitutes the high frequency filter 1. The mount component inductor has a higher Q-factor than that of an inductor formed of a wiring pattern conductor within a substrate. For example, the Q-factor of a mount component inductor is 20 or more at 2 GHz. Further, the mount component inductor is, for example, an inductor of multilayer type, an inductor of wire-wound type, or an integrated passive device (IPD) formed by thin film processing. Similarly, in the following working examples, the Q-factor of the mount component inductor is 20 or more at 2 GHz, and the mount component inductor is, for example, an inductor of multilayer type, an inductor of wire-wound type, or an IPD.

In the high frequency filter 1 using the LC resonant circuits (LPF 12 and HPF 13) (so-called hybrid filters) that are respectively constituted of the inductor L12 and the capacitive components of the parallel arm resonators P11 and P12 and the inductor L13 and the capacitive components of the series arm resonators S11 and S12, at least one of the inductors L11 to L13 includes a mount component inductor having a large Q-factor. This enables to improve the bandpass characteristic of the high frequency filter 1. Further, the mount component inductor has a small inductance value deviation. This enables to reduce variations of the filter characteristic.

2. Working Example 2

The configuration of a high frequency filter 2 according to the working example 2 is described.

Figure 3:
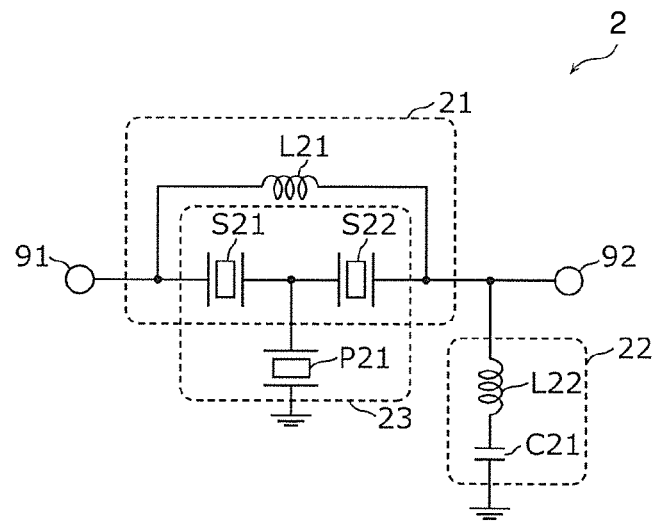
FIG. 3 is a circuit configuration diagram of a high frequency filter according to a working example 2.

FIG. 3 is a circuit configuration diagram of the high frequency filter 2 according to the working example 2. The high frequency filter 2 illustrated in FIG. 3 includes inductors L21 and L22, a capacitor C21, series arm resonators S21 and S22, a parallel arm resonator P21, and input/output terminals 91 and 92.

The series arm resonator S21 is an acoustic wave resonator provided on a path connecting the input/output terminal 91 and the input/output terminal 92. The series arm resonator S21 is connected to the input/output terminal 91. The series arm resonator S22 is an acoustic wave resonator provided on the path. The series arm resonator S22 is connected to the series arm resonator S21 and the input/output terminal 91. The series arm resonator S21 and the series arm resonator S22 are connected in series on the path.

The parallel arm resonator P21 is an acoustic wave resonator connected between ground and a node between the series arm resonators S21 and S22. The series arm resonators S21 and S22 and the parallel arm resonator P21 constitute a ladder circuit and constitute a bandpass filter (BPF) 23.

The inductor L21 is a first inductor that constitutes a part of a LC resonant circuit 21 and is connected in parallel to a circuit in which the series arm resonator S21 and the series arm resonator S22 are connected in series. Capacitive components of the series arm resonator S21 and the series arm resonator S22 constitute, with the inductor L21, a LC parallel resonant circuit that serves as the LC resonant circuit 21.

The inductor L22 is a second inductor that constitutes a part of a LC resonant circuit 22. The capacitor C21 is a capacitor connected in series to the inductor L22. A circuit in which the capacitor C21 and the inductor L22 are connected in series is connected between the ground and the path connecting the input/output terminal 91 and the input/output terminal 92. Specifically, this circuit is connected to the ground and a node between the series arm resonators S22 and the input/output terminal 92. The capacitor C21 constitutes, with the inductor L22, a LC series resonant circuit that serves as the LC resonant circuit 22.

Note that the number of the first inductors constituting the LC resonant circuit 21 is not limited to one and may be two or more. Note that each of the number of the second inductors and the number of the capacitors constituting the LC resonant circuit 22 is not limited to one and may be two or more.

Next, the filter characteristic of the high frequency filter 2 according to the working example 2 is described.

Figure 4:
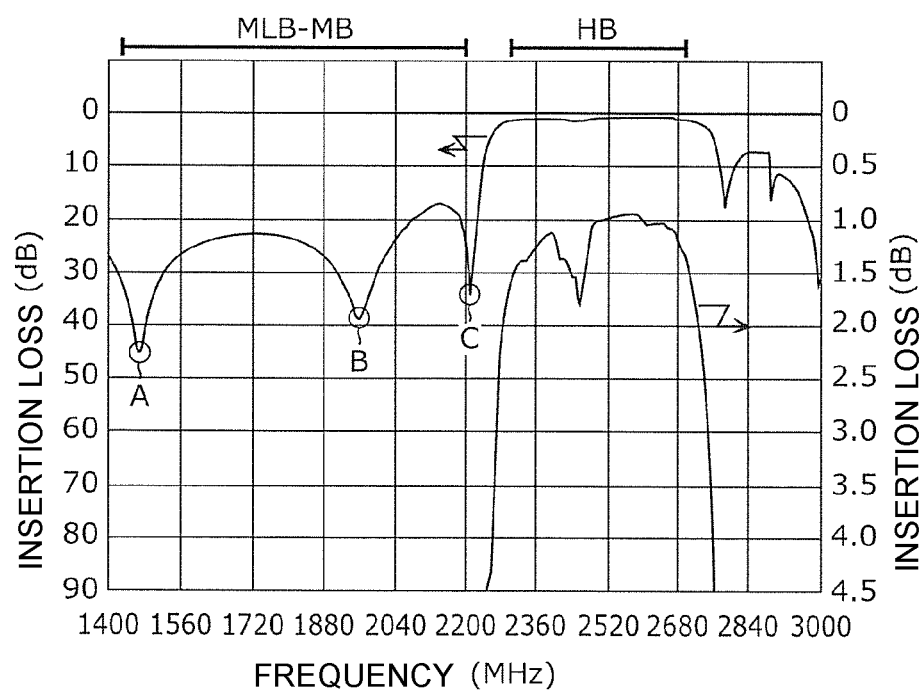
FIG. 4 is a diagram illustrating a filter characteristic of the high frequency filter according to the working example 2.

FIG. 4 is a diagram illustrating the filter characteristic of the high frequency filter 2 according to the working example 2.

The series arm resonators S21 and S22 and the parallel arm resonator P21 constitute the BPF 23, and this enables to form a passband where the insertion loss is reduced. Specifically, the passband is formed using resonant frequencies of the series arm resonators S21 and S22 and an anti-resonant frequency of the parallel arm resonator P21, an attenuation pole on the high frequency side of the passband is formed using anti-resonant frequencies of the series arm resonators S21 and S22, and an attenuation pole (first attenuation pole) on the low frequency side of the passband is formed using the anti-resonant frequency of the parallel arm resonator P21. Further, the LC resonant circuit 21 and the LC resonant circuit 22, each functions as a notch filter that attenuates the bandpass characteristic at their respective resonant frequencies by appropriately adjusting their respective design parameters.

For example, an attenuation pole illustrated in part A of FIG. 4 (referred to as attenuation pole A) corresponds to a resonant frequency of the LC resonant circuit 22, and an attenuation pole illustrated in part B of FIG. 4 (referred to as attenuation pole B) corresponds to a resonant frequency of the LC resonant circuit 21. Further, an attenuation pole illustrated in part C of FIG. 4 (referred to as attenuation pole C) corresponds to a resonant frequency of the parallel arm resonator P21.

As illustrated in FIG. 4, the frequency of the attenuation pole C (first attenuation pole) constituted of the resonant frequency of the parallel arm resonator P21 and the frequencies of the attenuation poles A and B (second attenuation pole) constituted of the resonant frequencies of the LC resonant circuit 21 and the LC resonant circuit 22 are included in one stopband of the high frequency filter 2. This allows the attenuation poles A and B and the attenuation pole C to form the one stopband. Therefore, this one stopband can be broadened using the attenuation poles A and B having gentle shapes formed by the LC resonant circuit 21 and the LC resonant circuit 22.

Further, the attenuation pole C on the low frequency side of the passband is formed by the resonant frequency of the parallel arm resonator P21, and therefore the frequency of the attenuation pole C is positioned closer to the passband of the high frequency filter 2 than the frequencies of the attenuation poles A and B. The steepness of an attenuation pole formed by an acoustic wave resonator is high, and the frequency of the attenuation pole C is positioned close to the passband of the high frequency filter 2. This enables the attenuation pole C having a steep shape to increase the steepness of an attenuation slope formed between the passband and the foregoing one stopband of the high frequency filter 2.

In the working example 2, the passband of the high frequency filter 2 is from 2300 MHz to 2690 MHz, which is HB, by appropriately adjusting design parameters of the series arm resonators S21 and S22, the parallel arm resonator P21, the inductors L21 and L22, and the capacitor C21. Further, the stopband of the high frequency filter 2 is from 1423 MHz to 2200 MHz, which is a band extending from MLB to MB.

This enables to realize a high frequency filter having a passband extending from 2300 MHz to 2690 MHz with a steep attenuation slope on the low frequency side and a broad stopband extending from 1423 MHz to 2200 MHz, which exists in a lower frequency range below the passband. As described above, broadening of the stopband can be realized while reducing the insertion loss within the passband.

Further, at least one of the inductors L21 and L22 is a mount component inductor. That is to say, all the inductors L21 and L22 may be mount component inductors, or at least one of the inductors L21 and L22 may be a mount component inductor.

In the high frequency filter 2 using the LC resonant circuit (so-called hybrid filter) constituted of the inductor L21 and the capacitive components of the series arm resonators S21 and S22, at least one of the inductors L21 and L22 includes a mount component inductor having a large Q-factor. This enables to improve the bandpass characteristic of the high frequency filter 2. Further, the mount component inductor has a small inductance value deviation. This enables to reduce variations of the filter characteristic.

3. Working Example 3

In the working example 2, the BPF 23 has a ladder-type filter structure made up of a series arm resonator whose series connection number is 2 and a parallel arm resonator whose parallel connection number is 1. However, the configuration of the BPF 23 is not limited thereto. For example, the BPF may have a ladder-type filter structure made up of three or more series arm resonators and two or more parallel arm resonators. The working example 3 is different from the working example 2 in that the BPF is a ladder circuit made up of three series arm resonators and two parallel arm resonators.

Figure 5:
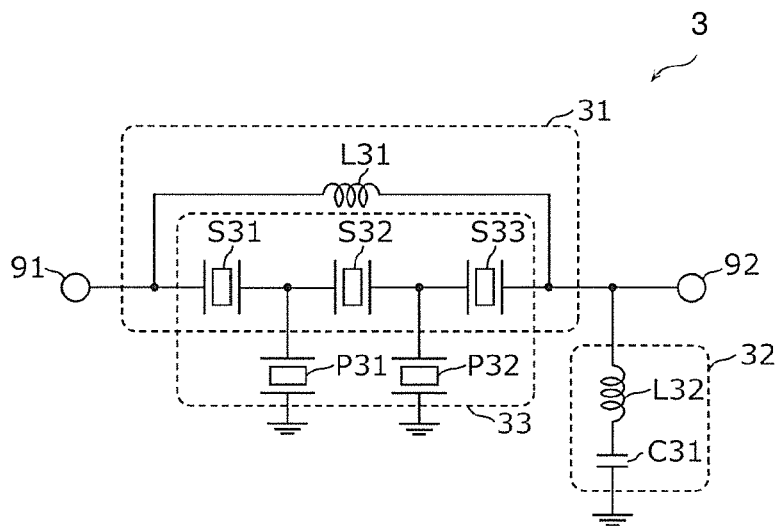
FIG. 5 is a circuit configuration diagram of a high frequency filter according to a working example 3.

FIG. 5 is a circuit configuration diagram of a high frequency filter 3 according to the working example 3. The high frequency filter 3 illustrated in FIG. 5 includes inductors L31 and L32, a capacitor C31, series arm resonators S31 to S33, parallel arm resonators P31 and P32, and input/output terminals 91 and 92.

The series arm resonator S31 is an acoustic wave resonator provided on a path connecting the input/output terminal 91 and the input/output terminal 92. The series arm resonator S31 is connected to the input/output terminal 91. The series arm resonator S33 is an acoustic wave resonator provided on the path. The series arm resonator S33 is connected to the input/output terminal 92. The series arm resonator S32 is an acoustic wave resonator connected between the series arm resonators S31 and S33. The series arm resonator S31, the series arm resonator S32, and the series arm resonator S33 are connected in series on the path.

The parallel arm resonators P31 and P32 are each an acoustic wave resonator connected between ground and a node between the series arm resonators S31 and S33. Specifically, the parallel arm resonator P31 is connected to the ground and the node between the series arm resonator S31 and the series arm resonator S32, and the parallel arm resonator P32 is connected to the ground and the node between the series arm resonator S32 and the series arm resonator S33. The series arm resonators S31 to S33 and the parallel arm resonators P31 and P32 constitute a ladder circuit and constitute a bandpass filter (BPF) 33.

The inductor L31 is a first inductor that constitutes a LC resonant circuit 31 and is connected in parallel to a circuit in which the series arm resonator S31, the series arm resonator S32, and the series arm resonator S33 are connected in series. Capacitive components of the series arm resonators S31 to S33 constitute, with the inductor L31, a LC parallel resonant circuit that serves as the LC resonant circuit 31.

The inductor L32 is a second inductor that constitutes a part of a LC resonant circuit 32. The capacitor C31 is a capacitor connected in series to the inductor L32. A circuit in which the capacitor C31 and the inductor L32 are connected in series is connected between the ground and the node directly connected to the input/output terminal 91 or 92 on the path connecting the input/output terminal 91 and the input/output terminal 92. Specifically, this circuit is connected to the ground and a node between the series arm resonators S33 and the input/output terminal 92. The capacitor C31 constitutes, with the inductor L32, a LC series resonant circuit that serves as the LC resonant circuit 32.

Note that the number of the first inductors constituting the LC resonant circuit 31 is not limited to one and may be two or more. Further, each of the number of the second inductors and the number of the capacitors constituting the LC resonant circuit 32 is not limited to one and may be two or more.

Next, the filter characteristic of the high frequency filter 3 according to the working example 3 is described.

Figure 6:
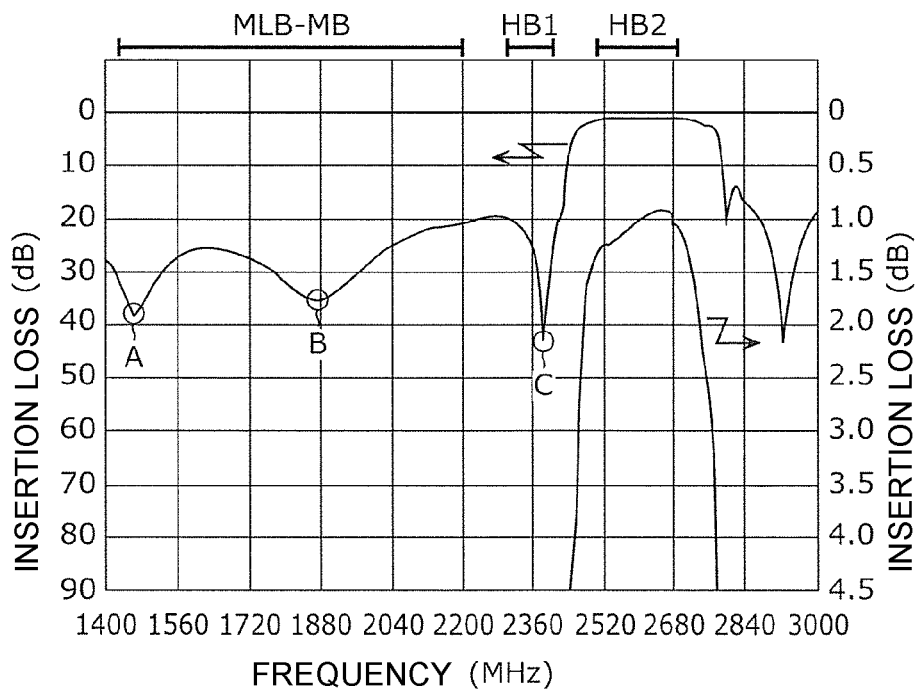
FIG. 6 is a diagram illustrating a filter characteristic of the high frequency filter according to the working example 3.

FIG. 6 is a diagram illustrating a filter characteristic of the high frequency filter 3 according to the working example 3.

The series arm resonators S31 to S33 and the parallel arm resonators P31 and P32 constitute the BPF 33, and this enables to form a passband where the insertion loss is reduced. Specifically, the passband is formed using resonant frequencies of the series arm resonators S31 to S33 and anti-resonant frequencies of the parallel arm resonators P31 and P32, an attenuation pole on the high frequency side of the passband is formed using anti-resonant frequencies of the series arm resonators S31 to S33, and an attenuation pole (first attenuation pole) on the low frequency side of the passband is formed using resonant frequencies of the parallel arm resonators P31 and P32. Further, the LC resonant circuit 31 and the LC resonant circuit 32, each functions as a notch filter that attenuates the bandpass characteristic at their respective resonant frequencies by appropriately adjusting their respective design parameters.

For example, an attenuation pole illustrated in part A of FIG. 6 (referred to as attenuation pole A) corresponds to a resonant frequency of the LC resonant circuit 32, and an attenuation pole illustrated in part B of FIG. 6 (referred to as attenuation pole B) corresponds to a resonant frequency of the LC resonant circuit 31. Further, an attenuation pole illustrated in part C of FIG. 6 (referred to as attenuation pole C) corresponds to a resonant frequency of at least one of the parallel arm resonators P31 and P32.

As illustrated in FIG. 6, the frequency of the attenuation pole C (first attenuation pole) constituted of the resonant frequencies of the parallel arm resonators P31 and P32 and the frequencies of the attenuation poles A and B (second attenuation pole) constituted of the resonant frequencies of the LC resonant circuit 31 and the LC resonant circuit 32 are included in one stopband of the high frequency filter 3. This allows the attenuation poles A and B and the attenuation pole C to form the one stopband. Therefore, this one stopband can be broadened using the attenuation poles A and B having gentle shapes formed by the LC resonant circuit 31 and the LC resonant circuit 32.

Further, the attenuation pole C on the low frequency side of the passband is formed by the resonant frequencies of the parallel arm resonators P31 and P32, and therefore the frequency of the attenuation pole C is positioned closer to the passband of the high frequency filter 3 than the frequencies of the attenuation poles A and B. The steepness of an attenuation pole formed by an acoustic wave resonator is high, and the frequency of the attenuation pole C is positioned close to the passband of the high frequency filter 3. This enables the attenuation pole C having a steep shape to increase the steepness of an attenuation slope formed between the passband and the foregoing one stopband of the high frequency filter 3.

In the working example 3, the passband of the high frequency filter 3 is from 2496 MHz to 2690 MHz, which is a HB2 (Band 41 of Long Term Evolution (LTE)), by appropriately adjusting design parameters of the series arm resonators S31 to S33, the parallel arm resonators P31 and P32, the inductors L31 and L32, and the capacitor C31. Further, the stopband of the high frequency filter 3 is from 1423 MHz to 2400 MHz, which is a band extending from MLB to HB1 (Band 40 of LTE). Note that HB1 is from 2300 MHz to 2400 MHz.

This enables to realize a high frequency filter having a passband extending from 2496 MHz to 2690 MHz with a steep attenuation slope on the low frequency side and a broad stopband extending from 1423 MHz to 2400 MHz, which exists in a lower frequency range below the passband. As described above, broadening of the stopband can be realized while reducing the insertion loss within the passband.

Further, at least one of the inductors L31 and L32 is a mount component inductor. That is to say, all the inductors L31 and L32 may be mount component inductors, or at least one of the inductors L31 and L32 may be a mount component inductor.

In the high frequency filter 3 using the LC resonant circuit (so-called hybrid filter) constituted of the inductor L31 and the capacitive components of the series arm resonators S31 to S33, at least one of the inductors L31 and L32 includes a mount component inductor having a large Q-factor. This enables to improve the bandpass characteristic of the high frequency filter 3. Further, the mount component inductor has a small inductance value deviation. This enables to reduce variations of the filter characteristic.

4. Working Example 4

In the working example 3, the high frequency filter 3 includes the LC resonant circuit 32. Alternatively, the high frequency filter 3 may not include the LC resonant circuit 32. The working example 4 is different from the working example 3 in that the high frequency filter does not include the LC resonant circuit 32. Further, the working example 4 is different from the working example 3 in that the high frequency filter includes at least two inductors connected in series.

Figure 7:
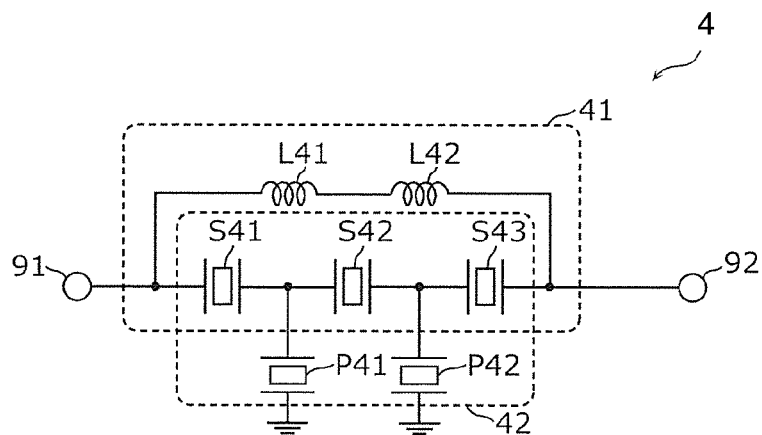
FIG. 7 is a circuit configuration diagram of a high frequency filter according to a working example 4.

FIG. 7 is a circuit configuration diagram of a high frequency filter 4 according to the working example 4.

Series arm resonators S41 to S43, parallel arm resonators P41 and P42, a LC resonant circuit 41, and a BPF 42 in the working example 4 respectively correspond to the series arm resonators S31 to S33, the parallel arm resonators P31 and P32, the LC resonant circuit 31, and the BPF 33 in the working example 3, and thus their descriptions are omitted.

The inductors L41 and L42 are first inductors that constitute the LC resonant circuit 41. A circuit in which the inductor L41 and the inductor L42 are connected in series is connected in parallel to a circuit in which the series arm resonator S41, the series arm resonator S42, and the series arm resonator S43 are connected in series. Capacitive components of the series arm resonators S41 to S43 constitute, with the inductors L41 and L42, a LC parallel resonant circuit that serves as the LC resonant circuit 41.

Next, the filter characteristic of the high frequency filter 4 according to the working example 4 is described.

Figure 8:
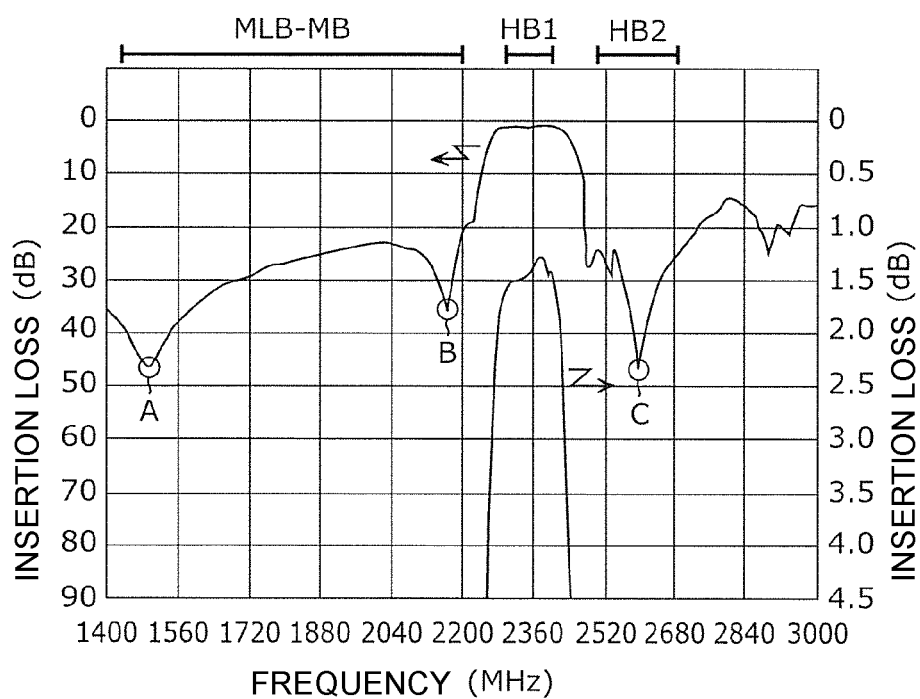
FIG. 8 is a diagram illustrating a filter characteristic of the high frequency filter according to the working example 4.

FIG. 8 is a diagram illustrating a filter characteristic of the high frequency filter 4 according to the working example 4.

The series arm resonators S41 to S43 and the parallel arm resonators P41 and P42 constitute the BPF 42, and this enables to form a passband where the insertion loss is reduced. Specifically, the passband is formed using resonant frequencies of the series arm resonators S41 to S43 and anti-resonant frequencies of the parallel arm resonators P41 and P42, an attenuation pole on the high frequency side of the passband is formed using anti-resonant frequencies of the series arm resonators S41 to S43, and an attenuation pole (first attenuation pole) on the low frequency side of the passband is formed using resonant frequencies of the parallel arm resonators P41 and P42. Further, the LC resonant circuit 41 functions as a notch filter that attenuates the bandpass characteristic at a resonant frequency thereof by appropriately adjusting design parameters thereof.

For example, an attenuation pole illustrated in part A of FIG. 8 (referred to as attenuation pole A) corresponds to a resonant frequency of the LC resonant circuit 41. Further, an attenuation pole illustrated in part B of FIG. 8 (referred to as attenuation pole B) corresponds to a resonant frequency of at least one of the parallel arm resonators P41 and P42. Further, an attenuation pole illustrated in part C of FIG. 8 (referred to as attenuation pole C) corresponds to an anti-resonant frequency of at least one of the series arm resonators S41 to S43.

As illustrated in FIG. 8, the frequency of the attenuation pole B (first attenuation pole) constituted of the resonant frequencies of the parallel arm resonators P41 and P42 and the frequency of the attenuation pole A (second attenuation pole) constituted of the resonant frequency of the LC resonant circuit 41 are included in one stopband of the high frequency filter 4. This allows the attenuation pole A and the attenuation pole B to form the one stopband. Therefore, the one stopband can be broadened using the attenuation pole A having a gentle shape formed by the LC resonant circuit 41. Further, the anti-resonant frequencies of the series arm resonators S41 to S43 constitute the attenuation pole C.

Further, the attenuation pole B on the low frequency side of the passband is formed by the resonant frequencies of the parallel arm resonators P41 and P42, and therefore the frequency of the attenuation pole B is positioned closer to the passband of the high frequency filter 4 than the frequency of the attenuation pole A. The steepness of an attenuation pole formed by an acoustic wave resonator is high, and the frequency of the attenuation pole B is positioned close to the passband of the high frequency filter 4. This enables the attenuation pole B having a steep shape to increase the steepness of an attenuation slope formed between the passband and the foregoing one stopband of the high frequency filter 4.

In the working example 4, the passband of the high frequency filter 4 is from 2300 MHz to 2400 MHz, which is a HB1, by appropriately adjusting design parameters of the series arm resonators S41 to S43, the parallel arm resonators P41 and P42, and the inductors L41 and L42. Further, one stopband of the high frequency filter 4 is from 1423 MHz to 2200 MHz, which is a band extending from MLB to MB. Further, another stopband of the high frequency filter 4 is from 2496 MHz to 2690 MHz, which is HB2.

This enables to realize a high frequency filter having a passband extending from 2300 MHz to 2400 MHz with a steep attenuation slope on the low frequency side and a broad stopband extending from 1423 MHz to 2200 MHz, which exists in a lower frequency range below the passband. As described above, broadening of the stopband can be realized while reducing the insertion loss within the passband.

Further, the inductors L41 and L42 are mount component inductors. In the high frequency filter 4 using the LC resonant circuit 41 (so-called hybrid filter) formed of the inductors L41 and L42 and the capacitive components of the series arm resonators S41 to S43, the inductors L41 and L42 include mount component inductors having large Q-factors. This enables to improve the bandpass characteristic of the high frequency filter 4. Further, the mount component inductor has a small inductance value deviation. This enables to reduce variations of the filter characteristic. Note that advantageous effects of dividing the inductor L31 of the working example 3 into two inductors of the working example 4, which are the inductors L41 and L42 connected in series, will be described later.

5. Exemplary Arrangement of Mount Component Inductors

Next, an exemplary arrangement of mount component inductors is described with reference to FIG. 9 and FIG. 10.

Figure 9:
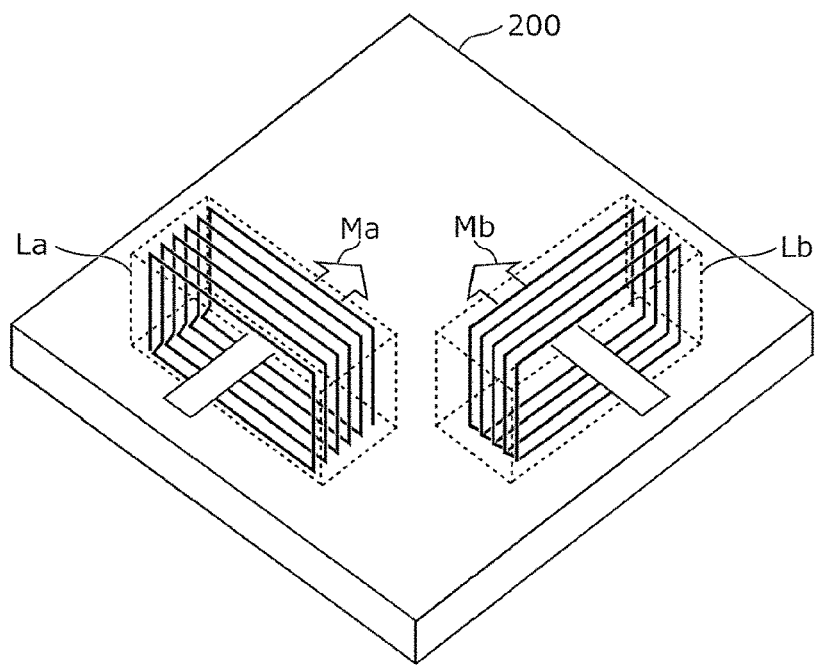
FIG. 9 is a diagram illustrating one example of arrangement of mount component inductors.

FIG. 9 is a diagram illustrating one example of arrangement of mount component inductors. FIG. 10 is a diagram illustrating another example of arrangement of mount component inductors.

On a substrate 200 that constitutes a high frequency filter, acoustic wave resonators, inductors, capacitors, and the like are mounted. Of these mounted components, FIG. 9 and FIG. 10 illustrate only the periphery of the part where the mount component inductors are mounted. As the mount component inductor, inductors La to Ld are illustrated. In the drawing, parts other than winding wires provided inside the inductors La to Ld are made transparent, and outer shapes of the inductors La to Ld are illustrated by dashed line. Further, a magnetic flux Ma generated by the inductor La, a magnetic flux Mb generated by the inductor Lb, a magnetic flux Mc generated by the inductor Lc, and a magnetic flux Md generated by the inductor Ld are denoted schematically by arrows.

Figure 10:
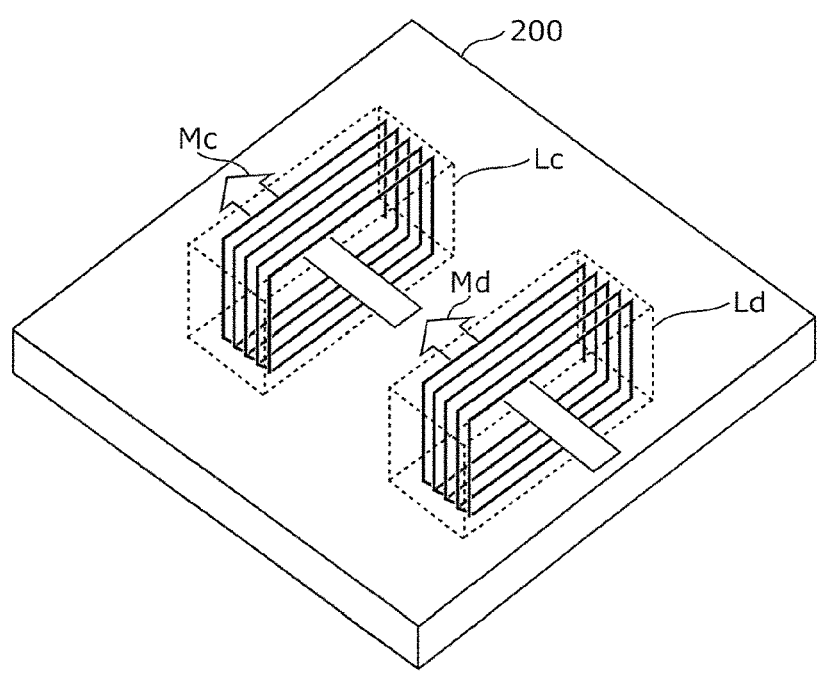
FIG. 10 is a diagram illustrating another example of arrangement of mount component inductors.

As illustrated in FIG. 9 and FIG. 10, the directions of the magnetic fluxes Ma to Md of the mount component inductors La to Ld are directions parallel to a principal surface of the substrate 200 on which the mount component inductors La to Ld are mounted. The winding wires are each formed by rotating wiring in such a manner as to draw a rectangle (or a circle) in a cross-sectional view of the substrate 200, and the magnetic fluxes Ma to Md are generated in the direction parallel to the principal surface of the substrate 200 in such a manner as to penetrate through the respective centers of the winding wires.

A ground solid pattern (not illustrated) is provided on the substrate 200 in the direction parallel to the principal surface of the substrate 200. Therefore, in the case where the directions of the magnetic fluxes Ma to Md are perpendicular to the principal surface, eddy currents are generated on the ground solid pattern, and the Q-factors of the inductors La to Ld degrade. Whereas, the directions of magnetic fluxes of the magnetic fluxes Ma to Md are parallel to the principal surface. This enables to suppress degradation of Q-factors of the mount component inductors La to Ld.

Further, the at least one inductor included in the high frequency filter includes a plurality of mount component inductors, and the plurality of mount component inductors includes at least two inductors whose magnetic fluxes are in directions different from each other. As the at least two inductors whose magnetic fluxes are in directions different from each other, FIG. 9 illustrates the inductors La and Lb. In FIG. 9, the direction of the magnetic flux Ma of the inductor La is orthogonal to the direction of the magnetic flux Mb of the inductor Lb. For example, the arrangements of the inductors L12 and L13 of the working example 1, the inductors L21 and L22 of the working example 2, and the inductors L31 and L32 of the working example 3 are the same as the arrangement of the inductors La and Lb illustrated in FIG. 9. This prevents electromagnetic coupling between the mount component inductors. Therefore, variation of the filter characteristic caused by interaction between the mount component inductors can be suppressed.

Further, the plurality of mount component inductors may include at least two inductors connected in series. The directions of magnetic fluxes of the at least two inductors may be the same with each other, and the at least two inductors may be electromagnetically coupled to each other. As the at least two inductors, FIG. 10 illustrates the inductors Lc and Ld. As illustrated in FIG. 10, the direction of the magnetic flux Mc of the inductor Lc is the same as the direction of the magnetic flux Md of the inductor Ld, and the inductors Lc and Ld are electromagnetically coupled by causing the magnetic fluxes Mc and Md to be generated in the same straight line. For example, the arrangements of the inductors L41 and L42 of the working example 4 is the same as the arrangement of the inductors Lc and Ld illustrated in FIG. 10.

Because of this, in the case where the inductors Lc and Ld are connected in series, a larger inductance value can be obtained by aligning the directions of the magnetic fluxes of the inductors Lc and Ld. That is to say, even in the case where the sum of the inductance values of the inductors is less than a desired inductance value, the desired inductance value can be obtained by electromagnetically coupling these inductors. For example, in the case where the desired inductance value is 40 nH, even if the inductance values of the inductors Lc and Ld are each 15 nH, 40 nH can be obtained by electromagnetically coupling the inductors Lc and Ld. Further, in general, a mount component inductor having a smaller inductance value has a larger Q-factor. Therefore, by connecting in series and electromagnetically coupling inductors each having a smaller inductance value, the Q-factor can be made larger while obtaining a desired inductance value. For example, by electromagnetically coupling the inductors Lc and Ld, each of the inductance values of the inductors Lc and Ld can be reduced from 20 nH to 15 nH. Therefore, the Q-factor of the inductors Lc and Ld can be made larger.

6. Working Examples 5 and 6

In recent years, to support carrier aggregation (CA), splitters are widely used for separating (splitting) high frequency signals into respective frequency bands. As such splitters, multiplexers each including a plurality of filters have been proposed. In such a multiplexer, terminals at one end portions of the filters form a common terminal by direct connection or via a phase shifter or a filter selection switch. Because of this, of the filters whose terminals at the one end portions formed the common terminal, the bandpass characteristic of one filter may be influenced by characteristics of other filters and may degrade.

Whereas, the high frequency filters using hybrid filters, which are described in the working examples 1 to 4, includes a mount component inductor having a large Q-factor as at least one inductor included in the high frequency filter. This enables to improve the bandpass characteristic of the high frequency filter. Further, in the high frequency filters described in the working examples 1 to 4, the steepness of the attenuation slope formed between the passband and the one stopband is high. Further, broadening of the one stopband is realized. Accordingly, by applying one of the high frequency filters according to the working examples 1 to 4 to one of the foregoing filters included in the multiplexer, the filter characteristic can be improved in the multiplexer.

In view of the above, in the working examples 5 and 6, multiplexers each including a plurality of filters are described. Here, the plurality of filters includes at least one high frequency filter described in the working examples 1 to 4, and input terminals or output terminals of the plurality of filters are connected to a common terminal directly or indirectly. The multiplexer may be a diplexer in the case where the plurality of filters includes two filters, a triplexer in the case where the plurality of filters includes three filters, and a quadplexer in the case where the plurality of filters includes four filters. Note that the plurality of filters may include five or more filters. In the working example 5, a multiplexer (triplexer) in which the plurality of filters includes three filters is described, and in the working example 6, a multiplexer (diplexer) in which the plurality of filters includes two filters is described.

Figure 11:
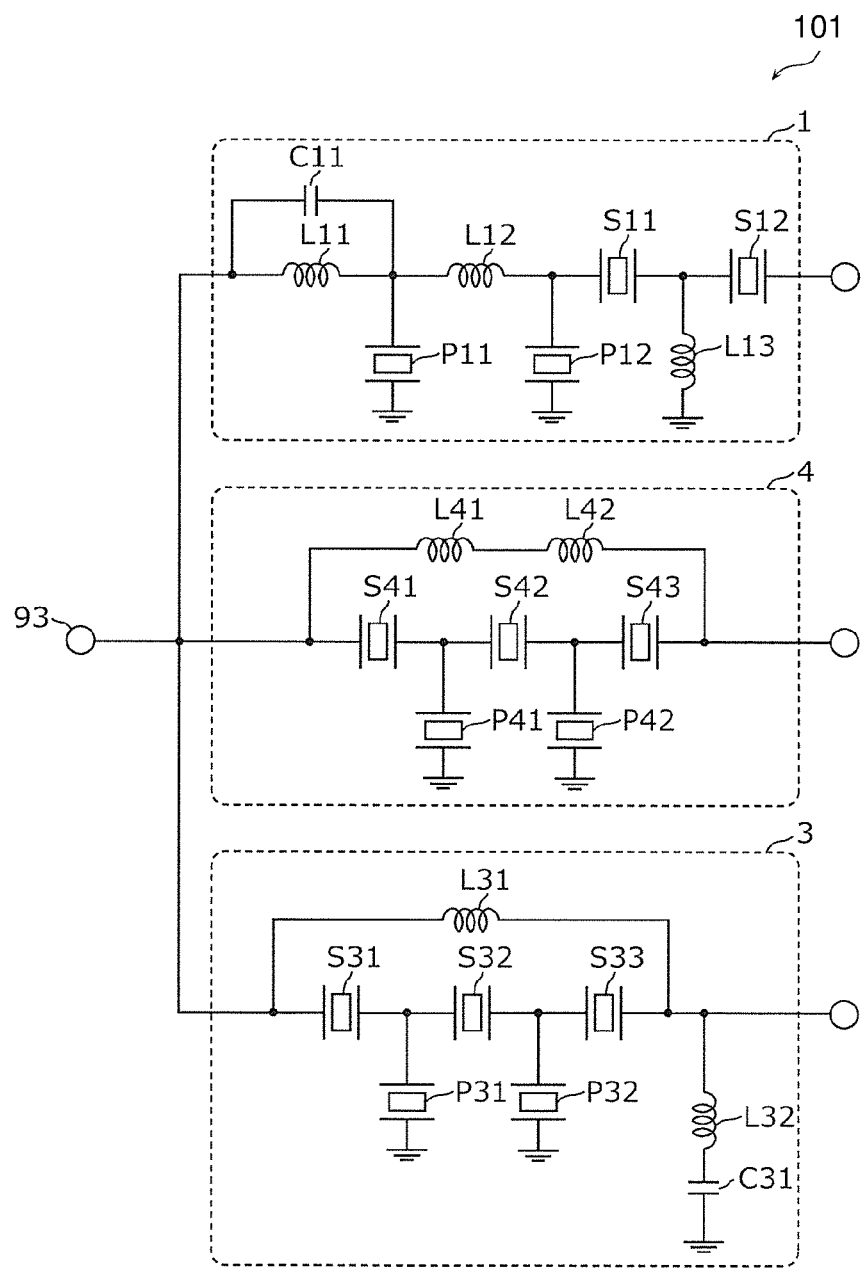
FIG. 11 is a circuit configuration diagram of a multiplexer (triplexer) according to a working example 5.

FIG. 11 is a circuit configuration diagram of a multiplexer (triplexer) 101 according to the working example 5. The multiplexer 101 includes the high frequency filter 1 according to the working example 1, the high frequency filter 3 according to the working example 3, and the high frequency filter 4 according to the working example 4. Input/output terminals 91 included in the respective high frequency filters are connected to a common terminal 93.

As illustrated in FIG. 2, the high frequency filter 1 has the broad stopband extending from 2300 MHz to 2690 MHz, which is HB. Whereas, as illustrated in FIG. 6, the high frequency filter 3 has the passband extending from 2496 MHz to 2690 MHz, which is HB2 included in HB, and as illustrated in FIG. 8, the high frequency filter 4 has the passband extending from 2300 MHz to 2400 MHz, which is HB1 included in HB. Accordingly, the passbands of the high frequency filters 3 and 4 are included in the stopband of the high frequency filter 1. Therefore, the high frequency filters 3 and 4 are unlikely to receive an influence of the high frequency filter 1, thereby enabling to suppress degradation of the bandpass characteristic in the passbands of the high frequency filters 3 and 4.

As illustrated in FIG. 6 and FIG. 8, the high frequency filters 3 and 4, each has the broad stopband extending from 1427 MHz to 2200 MHz, which is a band extending from MLB to MB. Whereas, as illustrated in FIG. 2, the high frequency filter 1 has the passband extending from 1427 MHz to 2200 MHz, which is a band extending from MLB to MB. Accordingly, the passband of the high frequency filter 1 overlaps the stopbands of the high frequency filters 3 and 4. Therefore, the high frequency filter 1 is unlikely to receive influences of the high frequency filters 3 and 4, thereby enabling to suppress degradation of the bandpass characteristic in the passband of the high frequency filter 1.

Further, as illustrated in FIG. 6, the high frequency filter 3 has the stopband extending from 2300 MHz to 2400 MHz, which is HB1. Whereas, as illustrated in FIG. 8, the high frequency filter 4 has the passband extending from 2300 MHz to 2400 MHz, which is HB1. Accordingly, the passband of the high frequency filter 4 overlaps the stopband of the high frequency filter 3. Therefore, the high frequency filter 4 is unlikely to receive an influence of the high frequency filter 3, thereby enabling to suppress degradation of the bandpass characteristic in the passband of the high frequency filter 4.

Further, as illustrated in FIG. 8, the high frequency filter 4 has the stopband extending from 2496 MHz to 2690 MHz, which is HB2. Whereas, as illustrated in FIG. 6, the high frequency filter 3 has the passband extending from 2496 MHz to 2690 MHz, which is HB2. Accordingly, the passband of the high frequency filter 3 overlaps the stopband of the high frequency filter 4. Therefore, the high frequency filter 3 is unlikely to receive an influence of the high frequency filter 4, thereby enabling to suppress degradation of the bandpass characteristic in the passband of the high frequency filter 3.

Further, although frequencies on the high frequency side of the passband of the high frequency filter 1 are close to frequencies on the low frequency side of the passband of the high frequency filter 4, the steepness of the attenuation slope on the high frequency side of the passband of the high frequency filter 1 is high, and the steepness on the low frequency side of the passband of the high frequency filter 4 is high. Therefore, each passband is unlikely to receive an influence of the other passband, thereby enabling to suppress degradation of the bandpass characteristic in the passband of each of the high frequency filters 1 and 4.

Further, although frequencies on the high frequency side of the passband of the high frequency filter 4 are close to frequencies on the low frequency side of the passband of the high frequency filter 3, the steepness of the attenuation slope on the high frequency side of the passband of the high frequency filter 4 is high, and the steepness on the low frequency side of the passband of the high frequency filter 3 is high. Therefore, each passband is unlikely to receive an influence of the other passband, thereby enabling to suppress degradation of the bandpass characteristic in the passband of each of the high frequency filters 3 and 4.

Further, at least one of the inductors L11 to L13, at least one of the inductors L31 and L32, and the inductor L41 are mount component inductors. This enables to improve the bandpass characteristics in a band from MLB to MB, HB1, and HB2.

Note that the multiplexer 101 may further include an LPF connected to the common terminal 93 in addition to the high frequency filters 1, 3, and 4. The passband of this LPF is, for example, from 600 MHz to 960 MHz, which is LB. In this case, the multiplexer 101 includes four filters including the filter whose passband is from 600 MHz to 960 MHz, the filter whose passband is from 1427 MHz to 2200 MHz, the filter whose passband is from 2300 MHz to 2400 MHz, and the filter whose passband if from 2496 MHz to 2690 MHz.

The multiplexer 101 configured in this way can support so-called CA that simultaneously transmits and receives signals at a plurality of frequency bands respectively corresponding to a plurality of filters.

Figure 12:
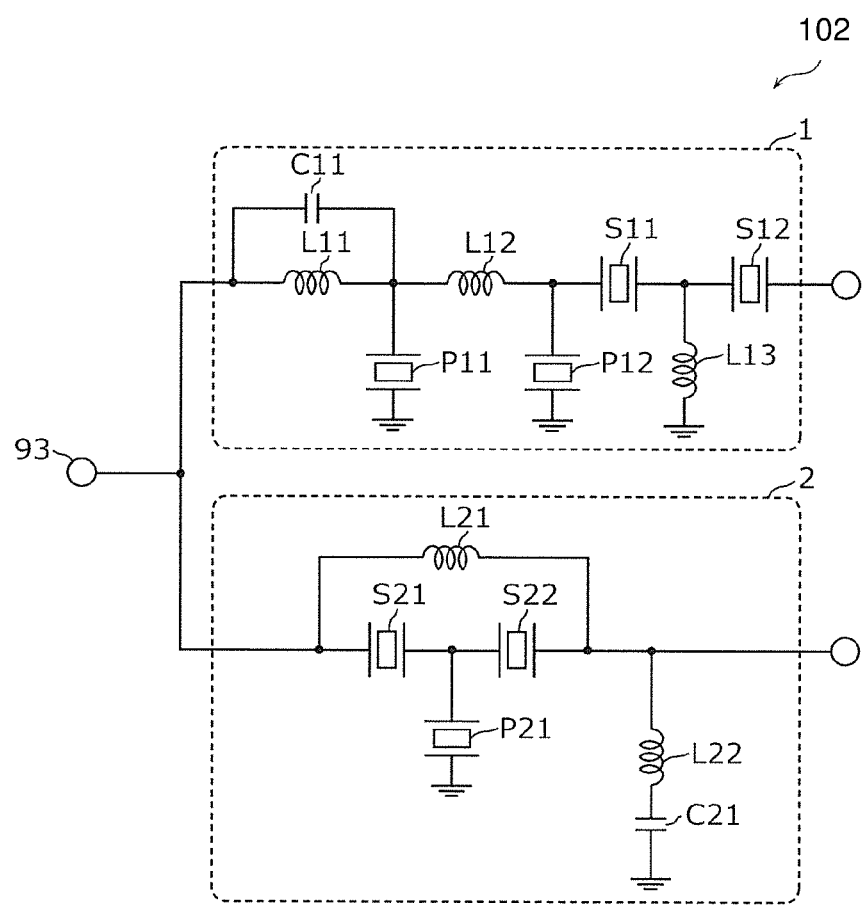
FIG. 12 is a circuit configuration diagram of a multiplexer (diplexer) according to a working example 6.

FIG. 12 is a circuit configuration diagram of a multiplexer (diplexer) 102 according to the working example 6. The multiplexer 102 includes the high frequency filter 1 according to the working example 1 and the high frequency filter 2 according to the working example 2. The input/output terminals 91 included in the respective high frequency filters are connected to the common terminal 93.

As illustrated in FIG. 2, the high frequency filter 1 has the broad stopband extending from 2300 MHz to 2690 MHz, which is HB. Whereas, as illustrated in FIG. 4, the high frequency filter 2 has the passband extending from 2300 MHz to 2690 MHz, which is HB. Accordingly, the passband of the high frequency filter 2 overlaps the stopband of the high frequency filter 1. Therefore, the high frequency filter 2 is unlikely to receive an influence of the high frequency filter 1, thereby enabling to suppress degradation of the bandpass characteristic in the passband of the high frequency filter 2.

As illustrated in FIG. 4, the high frequency filter 2 has the broad stopband extending from 1427 MHz to 2200 MHz, which is a band extending from MLB to MB. Whereas, as illustrated in FIG. 2, the high frequency filter 1 has the passband extending from 1427 MHz to 2200 MHz, which is a band extending from MLB to MB. Accordingly, the passband of the high frequency filter 1 overlaps the stopband of the high frequency filter 2. Therefore, the high frequency filter 1 is unlikely to receive an influence of the high frequency filter 2, thereby enabling to suppress degradation of the bandpass characteristic in the passband of the high frequency filter 1.

Further, although frequencies on the high frequency side of the passband of the high frequency filter 1 are close to frequencies on the low frequency side of the passband of the high frequency filter 2, the steepness of the attenuation slope on the high frequency side of the passband of the high frequency filter 1 is high, and the steepness on the low frequency side of the passband of the high frequency filter 2 is high. Therefore, each passband is unlikely to receive an influence of the other passband, thereby enabling to suppress degradation of the bandpass characteristic in the passband of each of the high frequency filters 1 and 2.

Further, at least one of the inductors L11 to L13 and at least one of the inductors L21 and L22 are mount component inductors. This enables to improve the bandpass characteristic in a band from MLB to MB and HB.

Note that the multiplexer 102 may further include an LPF connected to the common terminal 93 in addition to the high frequency filters 1 and 2. The passband of this LPF is, for example, from 600 MHz to 960 MHz, which is LB. In this case, the multiplexer 102 includes three filters including the filter whose passband is from 600 MHz to 960 MHz, the filter whose passband is from 1427 MHz to 2200 MHz, and the filter whose passband is from 2300 MHz to 2690 MHz.

The multiplexer 102 configured in this way can support so-called CA that simultaneously transmits and receives signals at a plurality of frequency bands respectively corresponding to a plurality of filters.

Embodiment 2

The high frequency filters described in the working examples of the embodiment 1 are applicable to high frequency front-end circuits and communication devices. Therefore, in the embodiment 2, a high frequency front-end circuit and a communication device are described.

Figure 13:
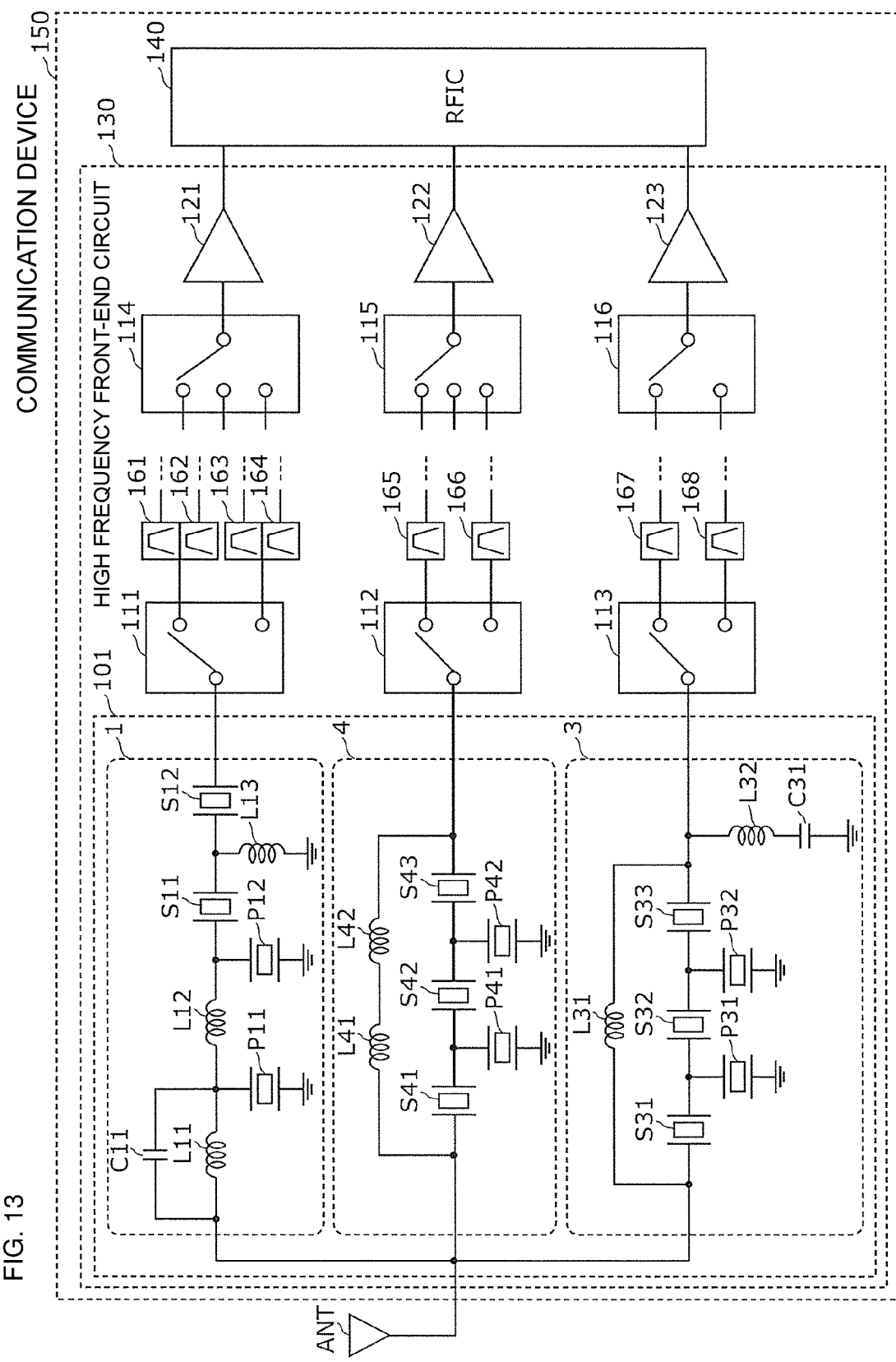
FIG. 13 is a circuit configuration diagram of a communication device according to an embodiment 2.

FIG. 13 is a circuit configuration diagram of a communication device 150 according to the embodiment 2.

As illustrated in FIG. 13, a communication device 150 includes a high frequency front-end circuit 130 and a RF signal processing circuit (RFIC) 140. Note that FIG. 13 illustrates an antenna element ANT. The antenna element ANT is a multiband antenna conform to communication standards such as, for example, LTE or the like for transmitting and receiving high frequency signals. The antenna element ANT may be included inside the communication device 150.

The high frequency front-end circuit 130 is a circuit that sends a high frequency signal between the antenna element ANT and the RFIC 140. Specifically, the high frequency front-end circuit 130 sends a high frequency signal (here, a high frequency reception signal) received by the antenna element ANT to the RFIC 140 via a reception-side signal path.

The high frequency front-end circuit 130 includes a multiplexer 101, switches 111 to 116, amplifier circuits 121 to 123, and bandpass filters (BPFs) 161 to 168. Each pair of the BPFs 161 and 162 and the BPFs 163 and 164 constitutes a duplexer. For example, the multiplexer 101 supports CA as described in the working example 5. Note that the multiplexer included in the high frequency front-end circuit 130 is not limited to the multiplexer 101 and may be any multiplexer constituted of a plurality of filters including at least one of the high frequency filters according to the working examples 1 to 4.

The switches 111 to 113 are connected between the multiplexer 101 and the BPFs 161 to 168 and connect signal paths and the BPFs 161 to 168 in response to a control signal from a controller unit (not illustrated). The signal paths correspond to a plurality of bands (here, the band extending from MLB to MB, HB1, and HB2) whose frequency bands are different from each other.

Specifically, a common terminal of the switch 111 is connected to the high frequency filter 1, and selection terminals of the switch 111 are connected to the BPFs 161 to 164. A common terminal of the switch 112 is connected to the high frequency filter 4, and selection terminals of the switch 112 are connected to the BPFs 165 and 166. A common terminal of the switch 113 is connected to the high frequency filter 3, and selection terminals of the switch 113 are connected to the BPFs 167 and 168.

The switches 114 to 116 are connected between the amplifier circuits 121 to 123 and the BPFs 161 to 168 and connect the BPFs 161 to 168 and the amplifier circuits 121 to 123 in response to a control signal from the controller unit (not illustrated).

Specifically, a common terminal of the switch 114 is connected to the amplifier circuit 121, and selection terminals of the switch 114 are connected to the BPFs 161 to 164. A common terminal of the switch 115 is connected to the amplifier circuit 122, and selection terminals of the switch 115 are connected to the BPFs 165 and 166. A common terminal of the switch 116 is connected to the amplifier circuit 123, and selection terminals of the switch 116 are connected to the BPFs 167 and 168.

Note that the passband of the high frequency filter 1 (1427 MHz to 2200 MHz) is broader than any one of the passbands of the BPFs 161 to 164 and includes all of the passbands. The passband of the high frequency filter 4 (2300 MHz to 2400 MHz) includes all of the passbands of the BPFs 165 and 166. The passband of the high frequency filter 3 (2496 MHz to 2690 MHz) includes all of the passbands of the BPFs 167 and 168.

The amplifier circuits 121 to 123 are low noise amplifiers that are, for example, connected to the multiplexer 101 via the switches 111 to 116 and the BPFs 161 to 168 and amplify the power of a high frequency reception signal received by the antenna element ANT.

The RFIC 140 is a RF signal processing circuit that processes a high frequency signal received by or to be transmitted from the antenna element ANT. Specifically, the RFIC 140 performs signal processing on a high frequency signal (here, a high frequency reception signal) input from the antenna element ANT via the reception-side signal path of the high frequency front-end circuit 130 using down-converting and the like, and outputs a reception signal generated by this signal processing to a baseband signal processing circuit (not illustrated).

In the communication device 150 having the foregoing configuration, CA operation can be performed by selecting one band from each of the band extending from MLB to MB (1427 MHz to 2200 MHz), HB1 (2300 MHz to 2400 MHz), and HB2 (2496 MHz to 2690 MHz), for example, by switching the switches 111 to 113.

Note that the high frequency front-end circuit 130 may include a transmission-side signal path or may send a high frequency signal (here, a high frequency transmission signal) output from the RFIC 140 to the antenna element ANT via the transmission-side signal path. In this case, the RFIC 140 may perform signal processing on a transmission signal input from the baseband signal processing circuit using up-converting and the like and output a high frequency signal (here, high frequency transmission signal) generated by this signal processing to the transmission-side signal path of the high frequency front-end circuit 130, and the amplifier circuits 121 to 123 may be power amplifiers that amplify the power of the high frequency transmission signal output from the RFIC 140.

The foregoing controller unit is not illustrated in FIG. 13. The RFIC 140 may include the foregoing controller unit or the controller unit may constitute a switch IC together with switches to be controlled.

According to the high frequency front-end circuit 130 and the communication device 150 configured as described above, a high frequency front-end circuit and a communication device, each of which is capable of improving the filter characteristic, can be realized by including the filter according to the working examples of the embodiment 1.

Other Embodiments

The high frequency filter, the multiplexer, the high frequency front-end circuit, and the communication device according to the present disclosure are described using the embodiments 1 and 2. However, the present disclosure is not limited to the foregoing embodiments. Other embodiments realized by combining arbitrary configuration elements of the foregoing embodiments, modified examples obtained by applying various modifications apparent to those skilled in the art to the foregoing embodiments without necessarily departing the scope of the present disclosure, and various devices including the high frequency filter, the multiplexer, the high frequency front-end circuit, and the communication device according to the present disclosure may also be included in the present disclosure.

For example, in a hybrid filter constituted of an acoustic wave resonator, an inductor, and a capacitor, a passband can be made narrower by connecting the acoustic wave resonator and the capacitor in parallel, and the steepness of an attenuation slope formed between the passband and a stopband can be increased. Further, in a hybrid filter constituted of an acoustic wave resonator, an inductor, and a capacitor, because the capacitor has a higher Q-factor compared with the acoustic wave resonator, by connecting the acoustic wave resonator and the capacitor in parallel or in series, the insertion loss of the filter can be improved and the distortion characteristic can also be improved.

Further, for example, the high frequency filter is only necessary to include at least the acoustic wave resonator and the first inductor. For example, in the working example 1, the high frequency filter 1 does not necessarily include the LC resonant circuit 11 and only necessary to include one of the LPF12 and the HPF 13. For example, in the working example 2, the high frequency filter 2 does not necessarily include the LC resonant circuit 22, and in the working example 3, the high frequency filter 3 does not necessarily include the LC resonant circuit 32.

Further, for example, in the foregoing working examples 1 to 4, the frequency of the first attenuation pole constituted of a resonant frequency or an anti-resonant frequency of at least one of the acoustic wave resonators and the frequency of the second attenuation pole constituted of a resonant frequency of the LC resonant circuit are included in one stopband of the high frequency filter. However, the frequency of the first attenuation pole and the frequency of the second attenuation pole are not necessarily included in one stopband. For example, a passband may be located between the first attenuation pole and the second attenuation pole.

Further, for example, each of the acoustic wave resonators described above may not necessarily be a single resonator and may be constituted of a plurality of divided resonators, which are obtained by dividing a single resonator.

Further, for example, in the high frequency filter, the multiplexer, the high frequency front-end circuit, and the communication device, an inductor or a capacitor may be connected between configuration elements. Note that the inductor may include a wiring inductor formed of wiring connecting between configuration elements.

Further, for example, in the working examples 5 and 6, the multiplexer includes a plurality of high frequency filters according to the working examples 1 to 4. However, the multiplexer is only necessary to include at least one of the high frequency filters according to the working examples 1 to 4. Further, for example, as a plurality of filters constituting the multiplexer may include a filter that does not include a hybrid filter.

Further, for example, in the embodiment 2, the high frequency front-end circuit 130 does not necessarily include both the switches 111 to 113 and the amplifier circuits 121 to 123 and is only necessary to include the switches 111 to 113 or the amplifier circuits 121 to 123 or both.

Further, the multiplexer described in the foregoing embodiment is used when splitting an input high frequency signal. Alternatively, the multiplexer may also be used when multiplexing input high frequency signals.

INDUSTRIAL APPLICABILITY

As a high frequency filter, a multiplexer, a front-end circuit, and a communication device, which are applicable to multiband systems, the present disclosure can be widely used in communication equipment such as cellular phones and the like.

REFERENCE SIGNS LIST 1, 2, 3, 4 High frequency filter
11, 21, 22, 31, 32, 41 LC resonant circuit
12 Lowpass filter (LPF)
13 Highpass filter (HPF)
23, 33, 42, 161, 162, 163, 164, 165, 166, 167, 168 Bandpass filter (BPF)
91, 92 Input/output terminal
93 Common terminal
101 Multiplexer (Triplexer)
102 Multiplexer (Diplexer)
111, 112, 113, 114, 115, 116 Switch
121, 122, 123 Amplifier circuit
130 High frequency front-end circuit
140 RF signal processing circuit (RFIC)
150 Communication device
200 Substrate
ANT Antenna element
C11, C21, C31 Capacitor
L12, L13, L21, L31, L41, L42 Inductor (First inductor)
L11, L22, L32 Inductor (Second inductor)
La, Lb, Lc, Ld Inductor
Ma, Mb, Mc, Md Magnetic flux
P11, P12, P21, P31, P32, P41, P42 Parallel arm resonator (Acoustic wave resonator)
S11, S12, S21, S22, S31, S32, S33, S41, S42, S43 Series arm resonator (Acoustic wave resonator)

The invention claimed is:
1. A high frequency filter comprising:
an acoustic wave resonator; and
at least one inductor, wherein:
a capacitive component of the acoustic wave resonator and a first of the inductors constitute a hybrid filter,
the at least one inductor comprises a plurality of mount component inductors, and the plurality of the mount component inductors comprises at least two mount component inductors having magnetic fluxes in different directions.

2. The high frequency filter according to claim 1, further comprising a capacitor, wherein the hybrid filter is further constituted by the capacitor.

3. The high frequency filter according to claim 1, wherein the first of the inductors comprises the plurality of mount component inductors.

4. The high frequency filter according to claim 1, further comprising a capacitor, wherein:
a second of the inductors and the capacitor constitute an LC resonant circuit, and
the second of the inductors comprises the plurality of mount component inductors.

5. The high frequency filter according to claim 1, wherein:
a stopband of the high frequency filter comprises a frequency of a first attenuation pole formed by the acoustic wave resonator and a frequency of a second attenuation pole formed by the plurality of mount component inductors, and
the frequency of the first attenuation pole is closer to a passband of the high frequency filter than the frequency of the second attenuation pole.

6. The high frequency filter according to claim 1, wherein a Q-factor of at least one of the mount component inductors is at least 20 at 2 GHz.

7. The high frequency filter according to claim 1, wherein the at least one of the plurality of mount component inductors is a multilayer type inductor, a wire-wound type inductor, or an integrated passive device.

8. The high frequency filter according to claim 1, wherein a direction of magnetic flux of at least one of the plurality of mount component inductors is parallel to a principal surface of a substrate on which the at least one of the plurality of mount component inductors is mounted.

9. The high frequency filter according to claim 1, wherein:
the plurality of the mount component inductors comprises at least two mount component inductors connected in series,
the at least two mount component inductors connected in series have magnetic fluxes in the same direction, and
the at least two mount component inductors connected in series are electromagnetically coupled.

10. The high frequency filter according to claim 1, wherein the hybrid filter is a high pass filter or a lowpass filter.

11. The high frequency filter according to claim 1, wherein:
the acoustic wave resonator is a series arm resonator in a ladder circuit, and
the first of the inductors is connected in parallel to the acoustic wave resonator.

12. A multiplexer comprising:
a plurality of filters comprising at least one high frequency filter according to claim 1,
wherein a common terminal of the multiplexer is connected to an input terminal or an output terminal of each of the plurality of filters.

13. A high frequency front-end circuit comprising:
the multiplexer according to claim 12, and
a switch connected to the multiplexer.

14. A communication device comprising:
a radio frequency (RF) signal processing circuit configured to process a high frequency signal received by or to be transmitted from an antenna, and
the high frequency front-end circuit according to claim 13, the high frequency front-end circuit being configured to send the high frequency signal between the antenna and the RF signal processing circuit.

15. A high frequency front-end circuit comprising:
a multiplexer according to claim 12, and
an amplifier circuit connected to the multiplexer.

16. A communication device comprising:
a radio frequency (RF) signal processing circuit configured to process a high frequency signal received by or to be transmitted from an antenna, and
the frequency front-end circuit according to claim 14, the high frequency front-end circuit being configured to send the high frequency signal between the antenna and the RF signal processing circuit.

\* \* \* \* \*

UNITED STATES PATENT AND TRADEMARK OFFICE
CERTIFICATE OF CORRECTION

PATENT NO. : 11,101,839 B2
APPLICATION NO. : 16/830661
DATED : August 24, 2021
INVENTOR(S) : Kido It is certified that error appears in the above-identified patent and that said Letters Patent is hereby corrected as shown below:

In the Specification

Column 13, Line 6, "LC resonant circuit" should read --LC resonant circuit 31--.

Column 24, Line 36, "the frequency front-end" should read --the high frequency front-end--.

Signed and Sealed this
Third Day of May, 2022

Katherine Kelly Vidal
*Director of the United States Patent and Trademark Office*